United States Patent
Wondimu et al.

(10) Patent No.: US 12,063,759 B2
(45) Date of Patent: Aug. 13, 2024

(54) CONFORMABLE COLD PLATE FOR FLUID COOLING APPLICATIONS

(71) Applicant: Intel Corporation, Santa Clara, CA (US)

(72) Inventors: Berhanu Wondimu, Beaverton, OR (US); David Shia, Portland, OR (US); Xudong Tang, Sammamish, WA (US)

(73) Assignee: Intel Corporation, Santa Clara, CA (US)

( * ) Notice: Subject to any disclaimer, the term of this patent is extended or adjusted under 35 U.S.C. 154(b) by 869 days.

(21) Appl. No.: 16/927,701

(22) Filed: Jul. 13, 2020

(65) Prior Publication Data

US 2020/0344918 A1    Oct. 29, 2020

(51) Int. Cl.
*H05K 7/20* (2006.01)
*B23P 15/26* (2006.01)
(Continued)

(52) U.S. Cl.
CPC .......... *H05K 7/20781* (2013.01); *B23P 15/26* (2013.01); *G05B 19/042* (2013.01);
(Continued)

(58) Field of Classification Search
CPC . H05K 7/20781; H05K 7/20772; B23P 15/26; G05B 19/042; G05B 2219/25252;
(Continued)

(56) References Cited

U.S. PATENT DOCUMENTS

| | | | | |
|---|---|---|---|---|
| 4,851,856 A | * | 7/1989 | Altoz | H01Q 1/002 |
| | | | | 165/46 |
| 6,216,771 B1 | * | 4/2001 | Holmberg | H01L 23/473 |
| | | | | 257/E23.098 |

(Continued)

FOREIGN PATENT DOCUMENTS

| | | |
|---|---|---|
| CN | 112969340 A | 6/2021 |
| GB | 2576030 | 2/2020 |

(Continued)

OTHER PUBLICATIONS

"Tube and pipe basics: How to achieve the perfect bend", the fabricator, https://www.thefabricator.com/thefabricator/article/tubepipefabrication/tube-and-pipe-basics-how-to-achieve-the-perfect-bend, Feb. 24, 2014, 6 pages.

(Continued)

*Primary Examiner* — Stephen S Sul
(74) *Attorney, Agent, or Firm* — HANLEY, FLIGHT & ZIMMERMAN, LLC

(57) ABSTRACT

Examples described herein relate to a sub-assembly for a fluid cooling system and the sub-assembly can include a fluid inlet, a fluid outlet, and at least one tube that is shaped to conform to surfaces of opposing dual inline memory modules (DIMMs). In some examples, the at least one tube is to connect to the fluid inlet and the fluid outlet. In some examples, the at least one tube includes a heat transferring material. In some examples, the DIMM includes memory devices and regions between memory devices. In some examples, the at least one tube is shaped with recesses to (Continued)

receive memory devices and shaped with protrusions to fit within the regions. In some examples, the at least one tube is formed as a re-shaped tube by shaping of a tube. In some examples, the re-shaped tube is formed by application of pressure within the tube and/or a vacuum external to the tube.

20 Claims, 11 Drawing Sheets

(51) Int. Cl.
*G05B 19/042* (2006.01)
*G06F 1/20* (2006.01)

(52) U.S. Cl.
CPC ...... *G06F 1/20* (2013.01); *G05B 2219/25252* (2013.01); *G05B 2219/25258* (2013.01); *G06F 2200/201* (2013.01)

(58) Field of Classification Search
CPC ............. G05B 2219/25258; G06F 1/20; G06F 2200/201; B21D 15/00; B21D 26/033; B21D 53/06
See application file for complete search history.

(56) References Cited

U.S. PATENT DOCUMENTS

| | | |
|---|---|---|
| 2011/0007476 A1* | 1/2011 | Joshi ................... G06F 1/20 165/185 |
| 2011/0286175 A1 | 11/2011 | Iyengar et al. |
| 2013/0120926 A1* | 5/2013 | Barina ............ H01L 23/4093 165/80.4 |
| 2013/0135812 A1* | 5/2013 | Barina ............ H01L 23/4093 165/173 |
| 2013/0194745 A1 | 8/2013 | Meijer et al. |
| 2014/0192476 A1* | 7/2014 | Chainer ................ G06F 1/20 361/702 |
| 2016/0026223 A1* | 1/2016 | Berk ............... H05K 7/20772 165/80.2 |
| 2018/0059744 A1* | 3/2018 | Brazel ............ H05K 7/20336 |
| 2018/0063998 A1* | 3/2018 | Aoki .................. G06F 1/203 |
| 2020/0305311 A1* | 9/2020 | Dallaserra ........... H05K 7/2039 |
| 2020/0337182 A1* | 10/2020 | Kanai ............. H05K 7/20772 |
| 2021/0320050 A1 | 10/2021 | Robinson et al. |

FOREIGN PATENT DOCUMENTS

| | | |
|---|---|---|
| GB | 2576032 | 2/2020 |
| GB | 2597525 | 2/2022 |
| GB | 2601357 | 6/2022 |

OTHER PUBLICATIONS

International Search Report and Written Opinion for PCT Patent Application No. PCT/CN2021/130052, Mailed May 12, 2022, 9 pages.

* cited by examiner

CONFORMABLE COLD PLATE FOR FLUID COOLING APPLICATIONS

With increasing thermal design power (TDP) of central processing units (CPUs) and other components, including, but not limited to memory devices, field programmable gate arrays, and storage devices, the overall power consumption of each chassis and rack in a data center is projected to increase dramatically. Cloud computing, high-performance computing (HPC), artificial intelligence (AI) could further push computing performance to higher levels and increase TDP to meet increasing computing needs. Liquid cooling technology is an option for cooling devices.

DETAILED DESCRIPTION

Liquid cooling technology has become a popular cooling option with increases in TDP and demand for better performance per watt in an eco-friendly data center. Liquid cooling technology attempts to cool devices by directing liquid within a tube and placing the tube in close proximity with a heat emitting device. The liquid absorbs heat and the heated liquid is directed away from the device. For example, circular tubes can be made of thermally conductive materials (e.g., copper). Tubes can directly contact a cold plate (e.g., aluminum) of a device that is to be cooled (e.g., central processing unit (CPU)). A cold plate (e.g., a tube carrying cooling fluid) can be directly mounted to the CPU surface to remove excess heat from the CPU. A thermal interface material (TIM) can be used to eliminate air gaps between the cold plate and the CPU to reduce thermal resistance for the heat flow.

One of the challenges in proliferating liquid cooling technology is a space limitation inside a server chassis, especially in 1U height systems, or other heights. Bending or deformation of the tubes may be required to fit the tubes within available space. Some fabrication processes for shaping a cold plate is based on forming of circular tubes and brazing of machined plate or block to the tube. A liquid cooling solution that uses this type of manufacturing process has limitations in achieving precise dimensions and often results in deformed or sizes that are out of specification. Some manufacturing processes like rolling and pressing have limitations in making high quality products due to inadequate control of material flow during the forming process.

Figure 1:
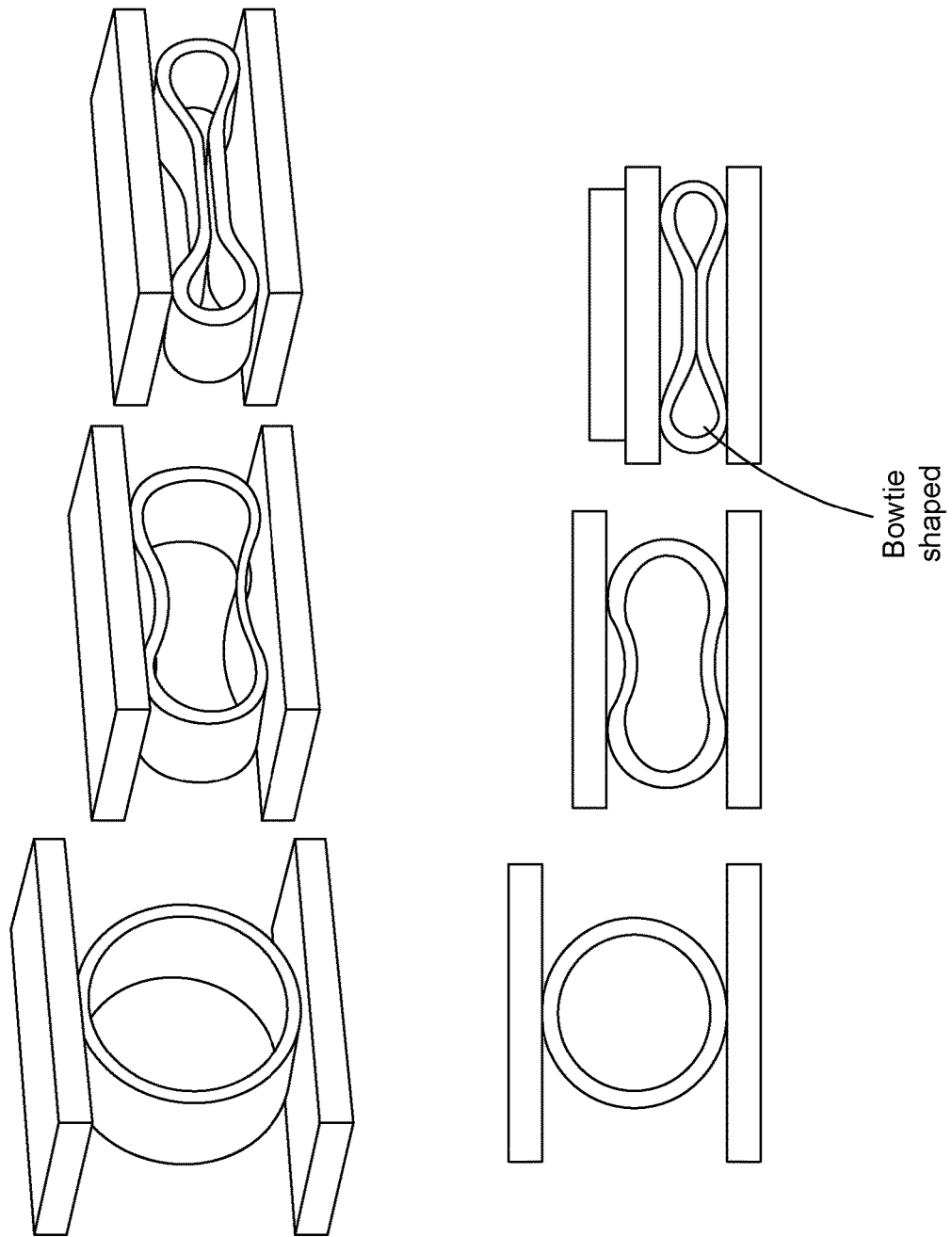
FIG. 1 shows an example of forming a shape of a tube.

FIG. 1 shows an example of forming a shape of a tube. For example, some manufacturing methods use a mechanical or hydraulic or pneumatic press to deform a tube held between guided clamps. The final shape of the deformed tube is determined by the shape of a clamp used to hold the tube and an amount of applied pressure or piston displacement. However, some manufacturing methods are less accurate in shaping the tube and often result in out-of-specification dimensions because of inadequate control on the deformation process. Externally applied pressure and the shape of holding clamp are control mechanisms for material flow in the forming process and there may be no manner to control the inside diameter of tube during this process. The finished tubes can sometimes be warped, kinked or wrinkled, which increases manufacturing cost and reduces yield. This non-conformance in shape and size can result in incorrect flow rate or pressure drop when the cold plate is used for cooling devices, resulting in worse than expected cooling performance and potentially inadequate cooling performance. A resulting shape that is bow-tie shaped can lack a flat surface and fully contact a chip. A bow-tie shape can increase pressure drop of fluid inside or restrict flow rate to provide less than optimal heat transfer. In some examples, the pressure drop may limit the pitch sizes in which the tube can be placed so that the tube cannot be placed in a small pitch region.

Because of manufacturing quality issues with forming a flattened copper tube, some cooling solutions for dual inline memory modules (DIMMs) use circular tubes. Circular tubes may not fit in smaller spaces resulting in reduced cooling efficiency. A DIMM pitch can be a distance between two consecutive DIMMs. As more DIMMs are stacked to increase density and capacity, the space between the DIMMs can decrease. A smaller gap between DIMMs creates a challenge to fit cooling tubes (cold plates). For example, a DIMM pitch (e.g., gap between DIMMs) that is too narrow to permit a tube to fit between DIMMs may lead to the DIMMs not receiving direct chip cooling compared to CPU cooling, where a cold plate in contact with the CPU can contact the tube for increased cooling. As DIMM pitch reduces to increase device density, fluid cooling solutions are needed for smaller DIMM pitches.

Various embodiments provide fabrication techniques to provide conformability of a cold plate to control a shape and size of formed tubes for use to direct fluid in proximity to heat emitting devices. For example, fluid can refer to liquid and/or gas or any state between liquid and gas. Various techniques can be used to control tube shapes and sizes to fit within and meet smaller design specifications. Various embodiments enable fabrication of tubes or plates to any shape based on a specific die design. Fabrication methods can be extended to make cooling solutions for other components such as PCIe or any interface standard that allows different high-speed components to communicate using a motherboard. Components connected via PCIe (e.g. Graphic Processing Unit, programmable gate array (FPGA) and artificial intelligence (AI) application specific integrated circuits (ASIC)) can draw high levels of power and require cooling to maintain good performance. Various embodiments can be used to cool power supplies whereby tube forming process may be combined with brazing and machining to develop a fluid cooling solution for power supplies. Various embodiments can be used to cool voltage regulators (VRs) whereby a shaped tube can be brazed-on a machined block to provide a coolant fluid close to the heat source. Other components can be cooled using shaped cooling tubes described herein.

In some embodiments, hydrostatic pressure can be applied inside a tube during the forming process to control the internal dimensions to design specifications. Various embodiments of a fabrication process can apply a fluid pressure inside the tube during the forming process to control material flow and improve quality of tube shape. A vacuum pressure can be applied between a clamping die and outside diameter of the tube during the forming process (e.g., for thicker wall tubes). In some examples a pressure inside the tube or vacuum external to the tube can be used but not both. The clamping dies can also incorporate heating and cooling systems to soften the tube during shaping of the tube and cooling when the desired shape is achieved. Using various embodiments, tubes can be formed of any shape with the design of appropriate clamping dies and use of pressure, heating and cooling.

Figure 2:
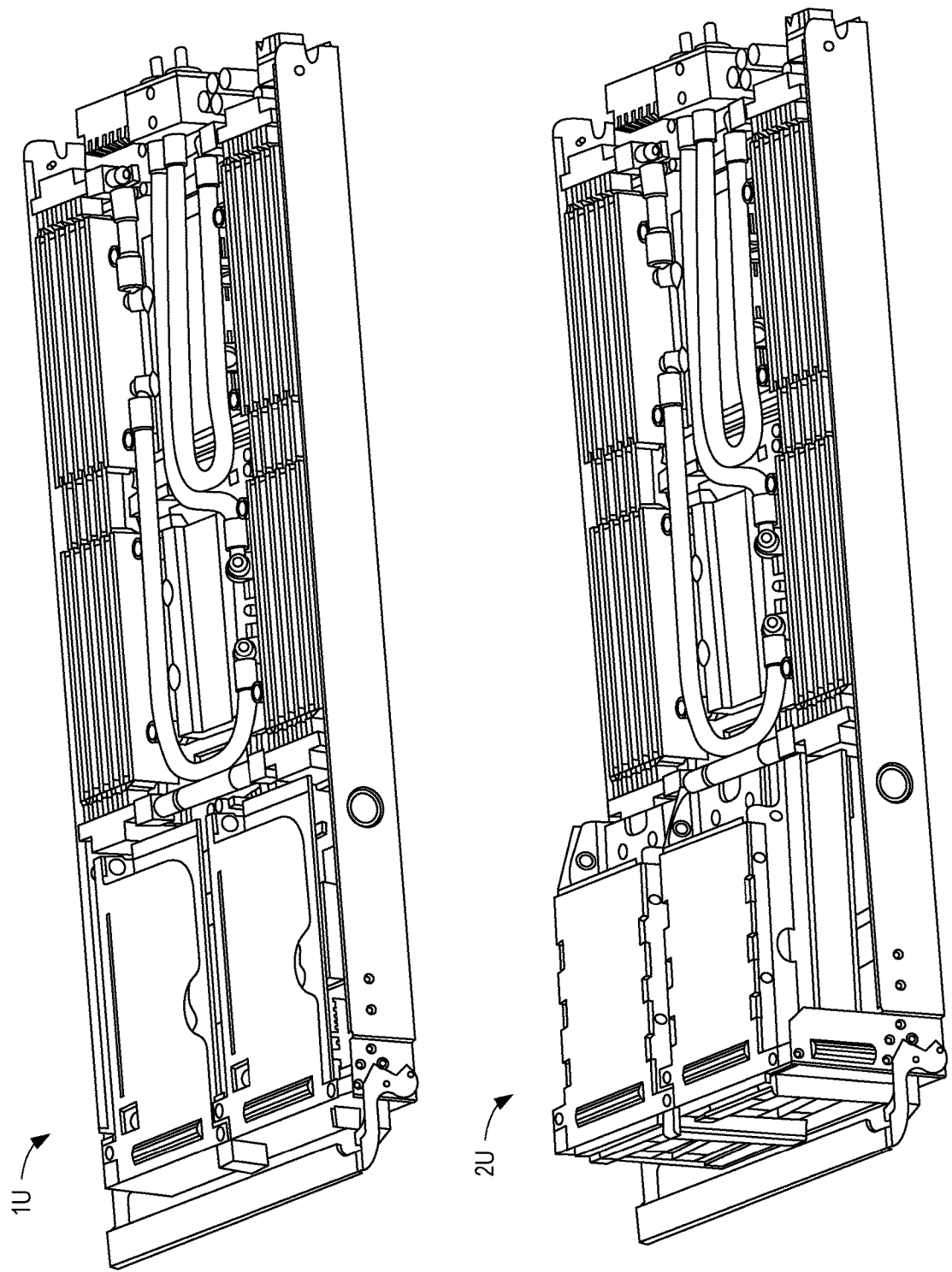
FIG. 2 depicts an example liquid cooled system.

FIG. 2 depicts an example fluid cooled system. For example, fluid cooling tubes can be placed to contact cold plates of CPUs but not between DIMMs. For example, 1U height rack unit and 2U height rack unit are depicted. A rack unit can be any height (e.g., 1U, 2U, 3U, etc.) and a circuit board, devices (e.g., CPUs, DIMMs, network interfaces, etc.), power supply heat sinks and other components can be placed within the particular rack unit height. For example, a 1U rack unit height can be 1.75 inches and a 2U rack unit height can be 3.5 inches, and so forth. A cooling distribution unit (CDU) can be provide cooled fluid through shaped tubes and receive heated fluid from the tubes. The cooling system can be used in a data center.

Figure 3:
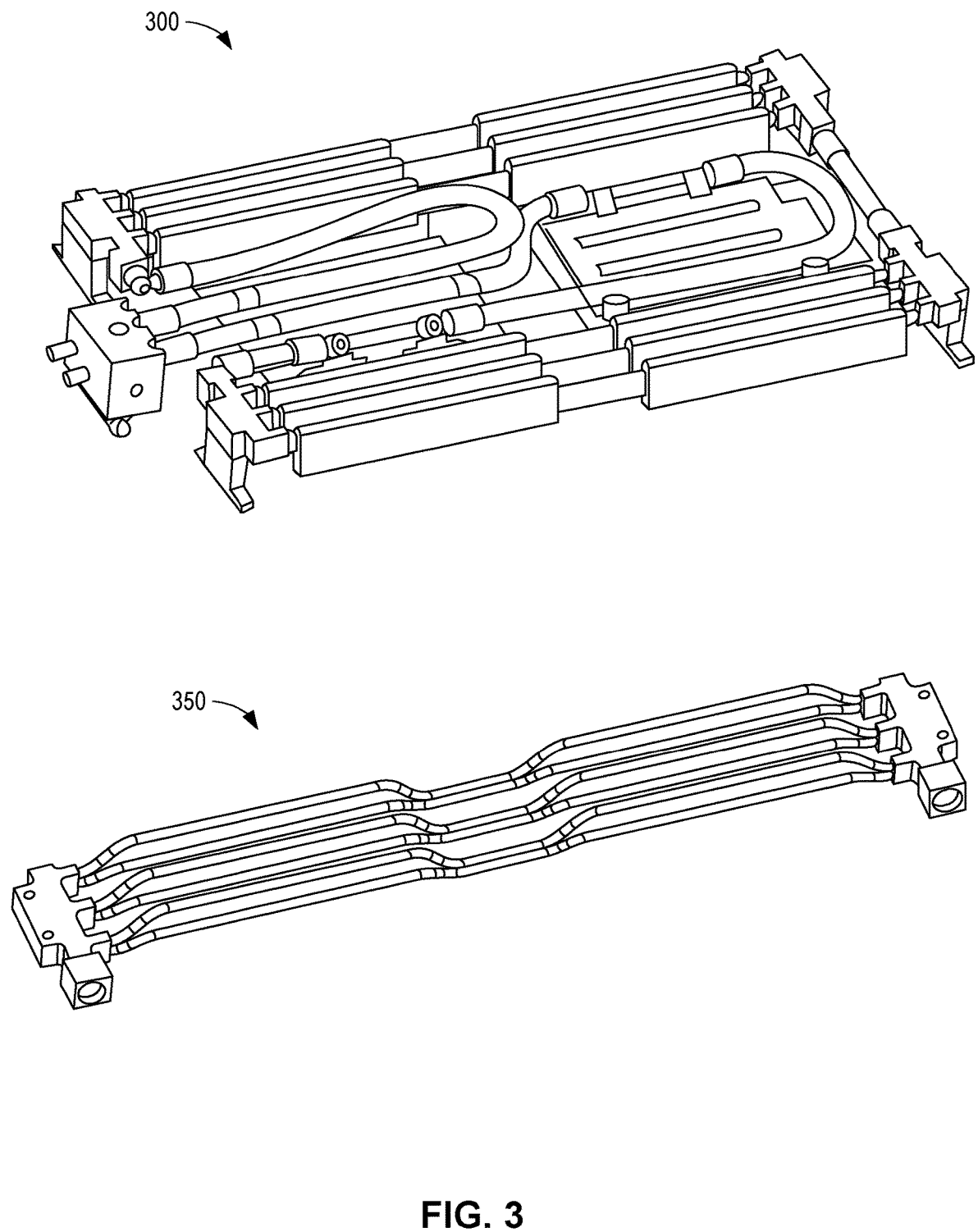
FIG. 3 shows a liquid cooling solution for a CPU and DIMM.

FIG. 3 shows a fluid cooling solution for a CPU and DIMM. System 300 includes a CPU and DIMMs with cooling solutions. System 350 shows tubes used for DIMM cooling that are formed by bending and flattening followed by brazing of tubes to manifold blocks at both ends. As the DIMM pitch decreases to increase capacity, it can be difficult to fit these tubes between the DIMM gaps.

Figure 4:
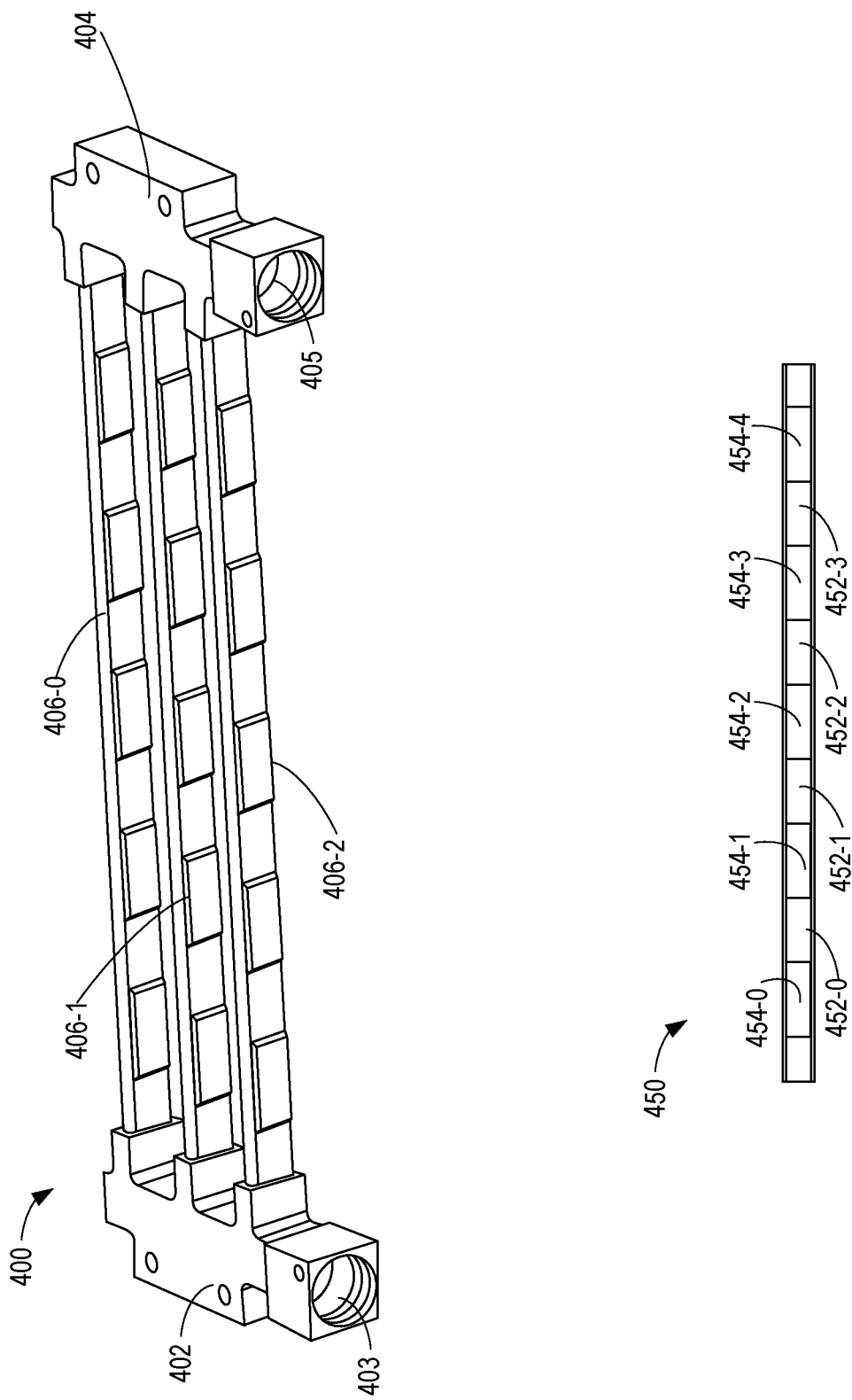
FIG. 4 depicts an example cooling sub-assembly that can be used at least to closely contour a DIMM.

FIG. 4 depicts an example cooling sub-assembly that can be used at least to closely contour a DIMM. For example, system 400 depicts an example of fluid supplier/receiver 402 and fluid supplier/receiver 404 coupled to DIMM tubes 406-0 to 406-2. For example, fluid supplier/receiver 402 can receive fluid through inlet 403 to provide to DIMM tubes 406-0 to 406-2. After the fluid flows through DIMM tubes 406-0 to 406-2, the fluid can reach fluid supplier/receiver 404 which provide the fluid through outlet 405 to a next component in the fluid flow path (e.g., another side of DIMM cooling tube sub-assembly or to a CPU cold plate). According to various embodiments, the design of clamping dies to form DIMM tubes 406-0 to 406-2 can be set to maximize coolant flow area using every space available between DIMMs.

FIG. 4 also depicts a side view 450 of any of DIMM tubes 406-0 to 406-2. Regions 452-0 to 452-3 can be indented or inset to contact a top of memory devices of a DIMM whereas extruded regions 454-0 to 454-4 can be extended to contact regions between memory devices (e.g., circuit board or other circuits or one or more memory controller chips). Use of regions 452-0 to 452-3 and extruded regions 454-0 to 454-4 can provide increased heat absorption from a DIMM via contouring or conforming to the DIMM by increasing coolant flow volume using space available between DIMM chipsets.

Figure 5:
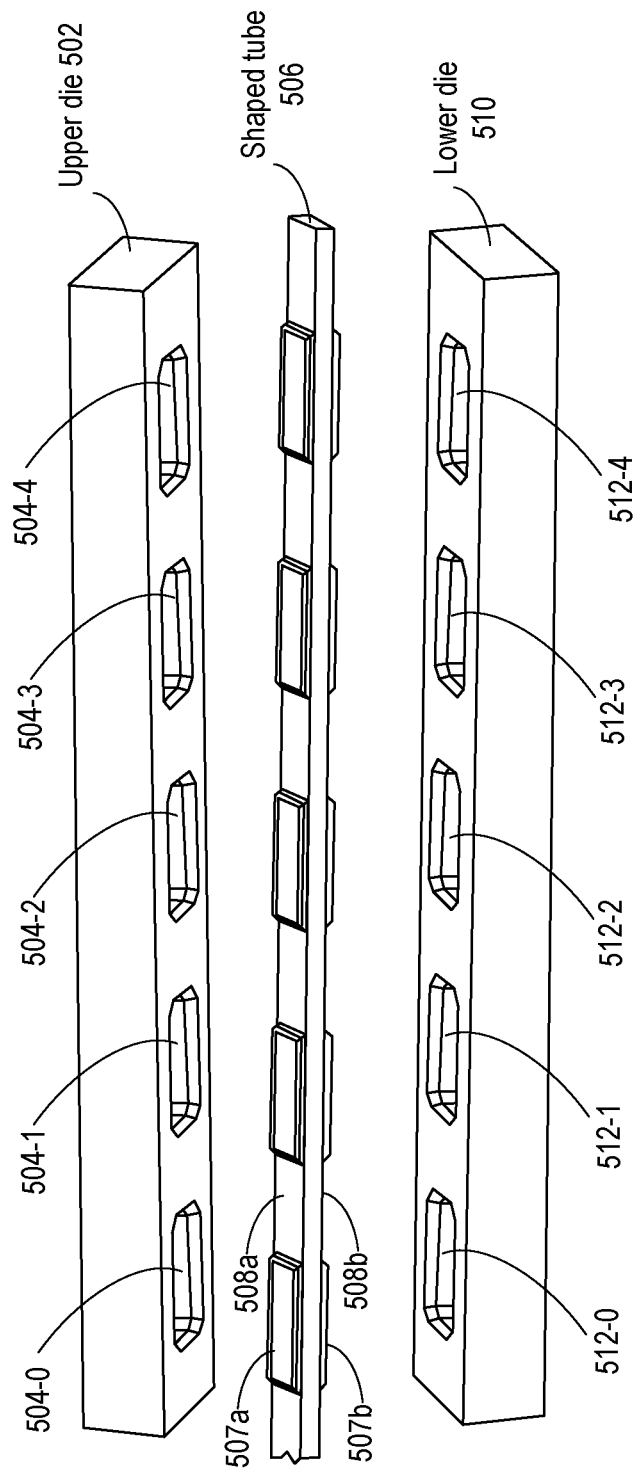
FIG. 5 depicts a schematic representation of a die setup for forming a cold plate for a DIMM.

FIG. 5 depicts a schematic representation of a die setup for forming a cold plate for a DIMM. For example, an upper die 502 can be formed with cavity regions 504-0 to 504-4 that can define shapes and depths of extruded regions 507A and regions 508A of shaped tube 506. For the sake of clarity, merely one extruded region 507A is labeled but any number extruded regions can be formed in shaped tube 506. The number of extruded regions 507A can be set based on a number of spaces between memory chips on a DIMM, for example. For the sake of clarity merely one region 508A is labeled but six such regions can be formed in shaped tube 506. The number of regions 508A can be set based on a number of memory chips on a DIMM, for example.

Similarly, lower die 510 can be formed with cavity regions 512-0 to 512-4 that can define shapes and depths of extruded regions 507B and regions 508B of shaped tube 506. For the sake of clarity merely one extruded region 507B is labeled but five lower extruded regions can be formed in shaped tube 506. The number of extruded regions 507B can be set based on a number of spaces between memory chips on an adjacent DIMM, for example. For the sake of clarity merely one region 508B is labelled but six such lower regions can be formed in shaped tube 506. The number of regions 508B can be set based on a number of memory chips on a DIMM, for example. Note that the number of extruded regions on opposite sides of shaped tube 506 can be the same number or different number. Note that the number of non-extruded regions on opposite sides of shaped tube 506 can be the same number or different number. The non-extruded regions can be shaped to contour any device placed between memory chips such as a memory controller device.

Shaped tube 506 can be placed between adjacent DIMMs such that extruded regions on one side of shaped tube 506 are between memory dies of one DIMM and extruded regions on another side of shaped tube 506 are between memory dies of another DIMM. In some examples, the extruded regions are in contact with regions between memory dies and contact opposing edges of different memory dies on a same side of a DIMM. In some examples, the extruded regions do not contact regions between memory dies and do not contact opposing edges of different memory dies on a same side of a DIMM. In some examples the extruded regions do not contact regions between memory dies but contact opposing edges of different memory dies on a same side of a DIMM. In some examples the extruded regions contact regions between memory dies but do not contact opposing edges of different memory dies on a same side of a DIMM.

Figure 6:
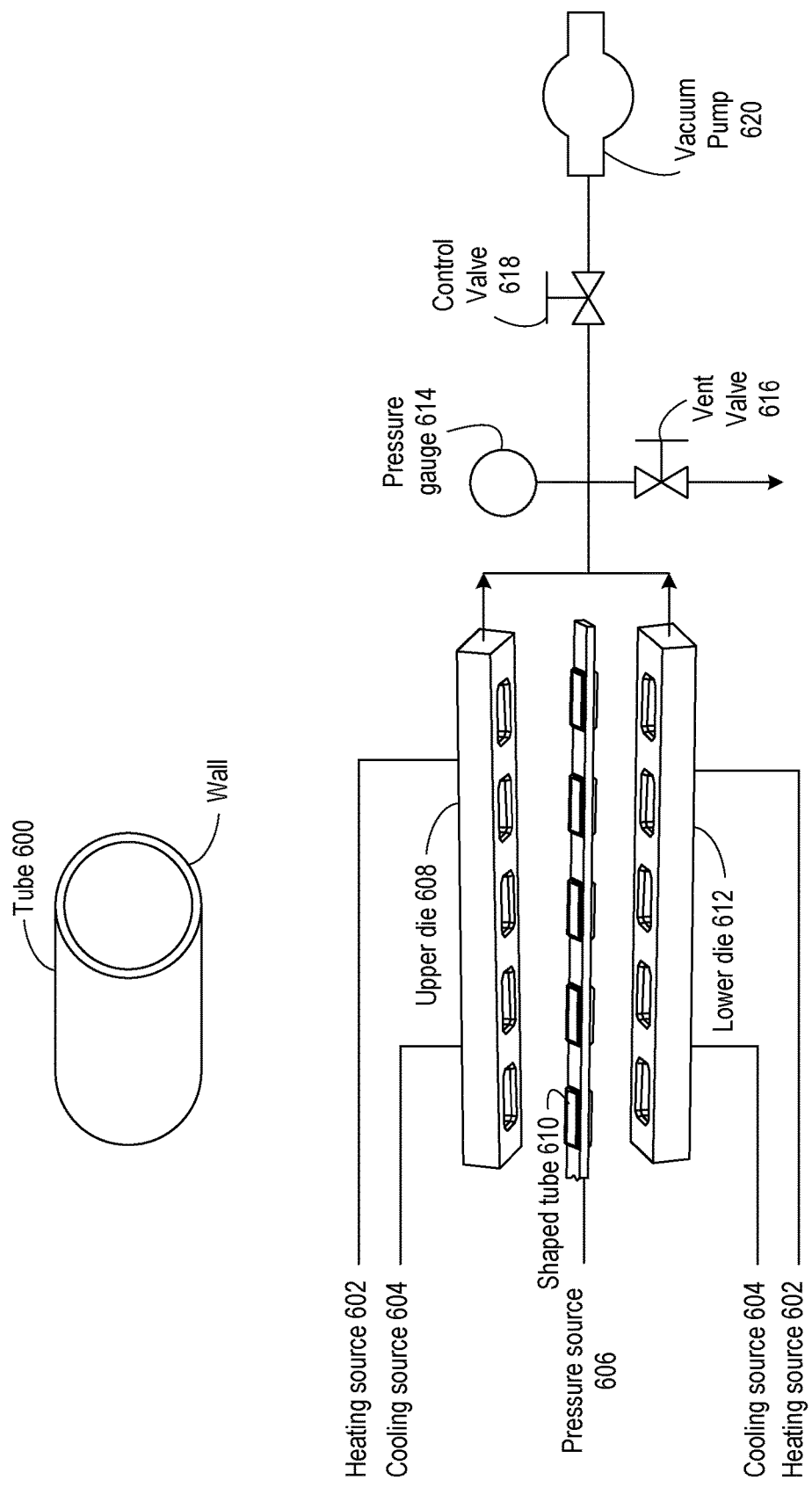
FIG. 6 shows a fluid cooling shaped tube formation system.

Description turns next to an example of forming a shaped tube using upper and lower dies. FIG. 6 shows a fluid cooling shaped tube formation system. In some examples, a circular or semi-circular tube is shaped into shaped tube 610. A circular tube 600 with a hollow center and approximately uniform thickness walls can be placed between upper die 608 and lower die 612. Tube 600 can be any shape (e.g., square, oval, and so forth). For example, the tube can be made of copper, deformable material or alloy (e.g., mixture of two or more metallic elements), or other heat transferring material. A wall thickness can be 0.5 mm to 1 mm, but the thickness can vary based on application (e.g., pressure, flow, form factor, and so forth). Heating source 602 can heat upper die 608 and lower die 612 during the shaping of shaped tube 610 in order to soften the tube during shaping of the tube. For example, heating source 602 can generate heat using induction, hot oil, induction, resistance coil, hot oil circulation, and so forth. During heating of the tube, pressure source 606 can apply pressurized air or other gas or a pressurized fluid (e.g., water or non-corrosive liquid) into the tube. The applied air or gas pressure or fluid pressure can be equal to or slightly higher than pressure applied outside shaped tube 610.

During heating of the tube, vacuum pump 620 can create a vacuum on the outside surface of the tube by evacuating air and gas from a chamber in which shaped tube 610 is formed. Pressure gauge 614, vent valve 616, and control valve 618 can be controlled to achieve a desired vacuum in a chamber in which shaped tube 610 is formed. After the tube is shaped, cooling source 604 can cool shaped tube 610 to room temperature or other temperature for solidification of shaped tube 610. For example, cooling source 604 can provide a coolant fluid (e.g., water, glycol, refrigerant, and so forth). Pressure source 606 and vacuum pump 620 can be turned off after shaped tube 610 is formed. The shaped tube can be used with a sub-assembly to route fluid in close proximity with a device that emits heat.

While examples have been provided for cooling tubes that contour or conform to a shape of one or more DIMMs, the resulting tube and corresponding die design can be changed depending on the desired shape. Some examples provide for tubes contouring or conforming to shapes of any circuit board with devices connected to the circuit board and not merely DIMMs. Any shaped tube can be created that fits within available spaces near any heat emitting devices (e.g., memory devices, persistent memory devices, storage devices, CPU, GPU, general purpose GPU (GPGPU), accelerator, and so forth). Process control variables, such as clamping die design, applied pressure, heating or cooling systems, and vacuum systems can be optimized to manufacture a wide variety of tube shapes to meet application requirements.

In some examples, tubes can contour or conform to circuit boards with any memory, persistent memory, or storage devices in a Ruler Form factor module. Ruler Form factor devices can include hot-swappable modules that can include NAND flash or Intel® 3D XPoint persistent memory chips mounted on circuit boards. In some examples, tubes can contour or conform to space between Ruler Form factor modules.

Figure 7:
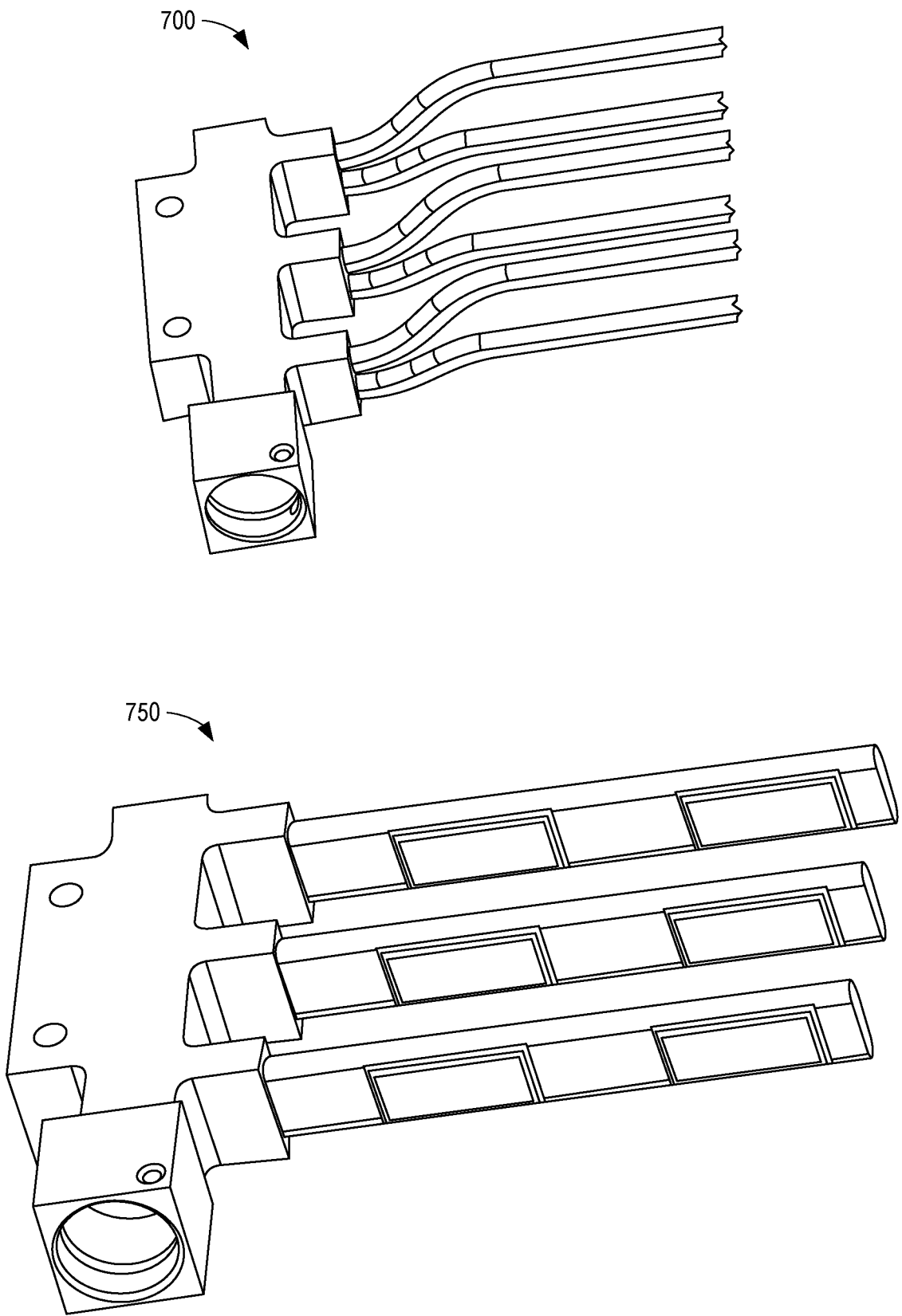
FIG. 7 depicts an example tube cooling sub-assembly and cooling sub-assembly in accordance with various embodiments.

FIG. 7 depicts an example tube cooling sub-assembly and cooling sub-assembly in accordance with various embodiments. Sub-assembly 700 can be formed using brazing of machined plate or block. By contrast, sub-assembly 750 can be formed using various embodiments described herein. Fluid flowing through sub-assembly 750 can capture and transfer heat from devices more readily than can sub-assembly 700.

Figure 8:
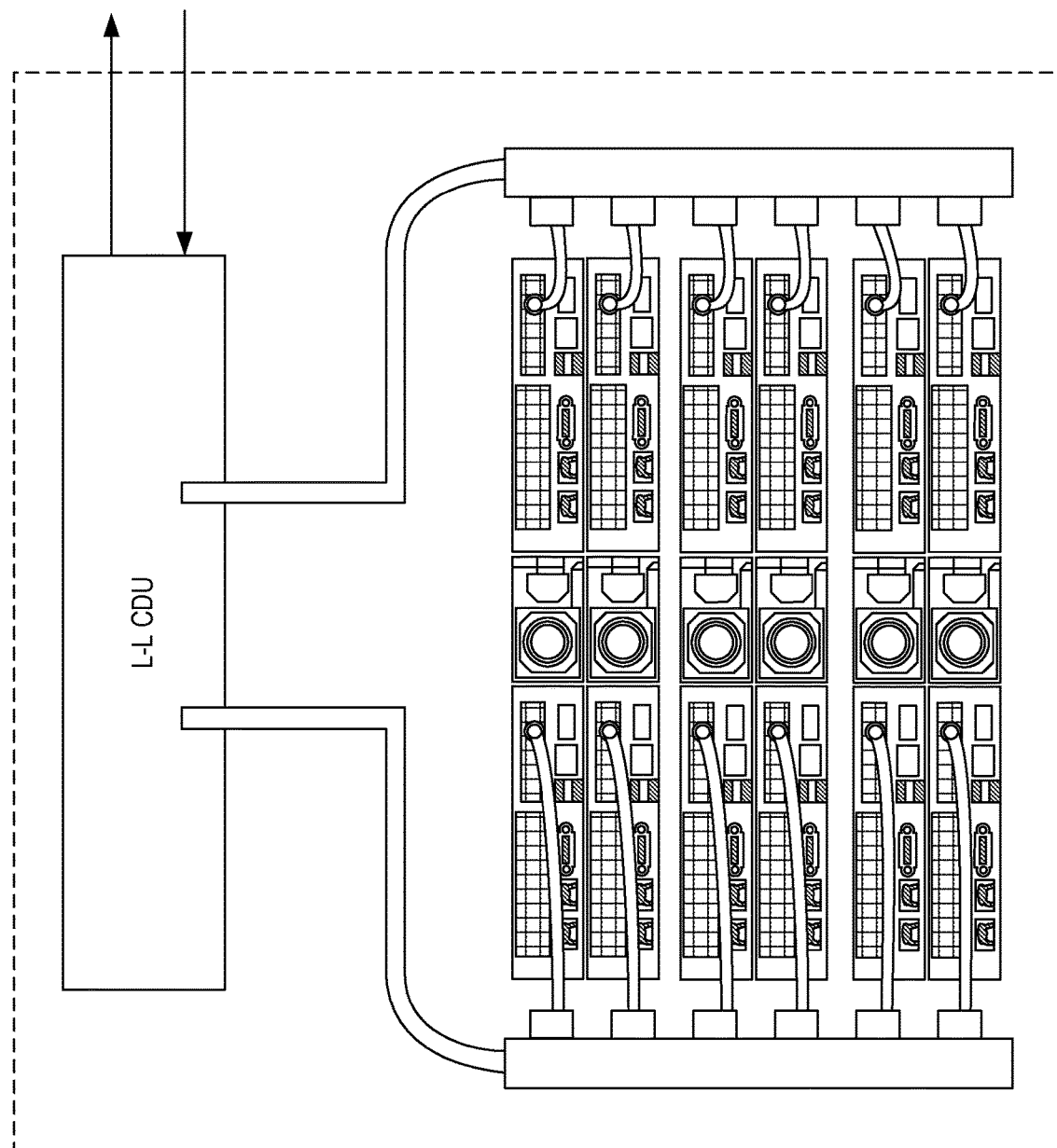
FIG. 8 shows an example of closed chassis with a cooling system that can use shaped tubes in accordance with various embodiments.

FIG. 8 shows an example of closed chassis with a cooling system that can use shaped tubes in accordance with various embodiments. For example, a sled with four 1U height rack units can be cooled using a cooling system that uses the shaped tubes.

Figure 9:
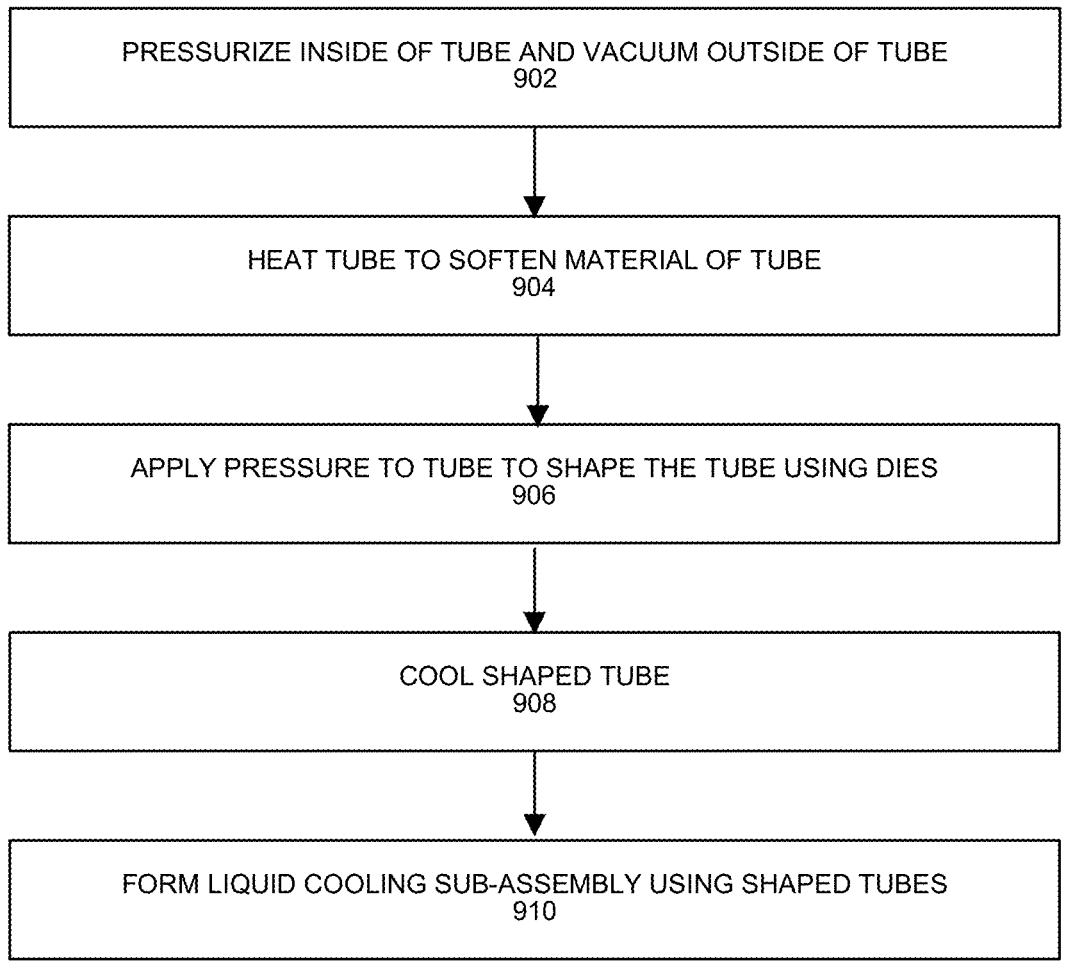
FIG. 9 depicts an example process.

FIG. 9 depicts an example process for fabrication of a tube for use to channel fluid for cooling of one or more devices. At 902, an inside of a tube is pressurized. For example, the inside of the tube can be pressurized using fluid. At 902, a vacuum can be formed outside of the tube in some examples. In some examples, either the inside of the tube is pressurized or a vacuum is formed outside the tube but not both. At 904, the tube is heated to an appropriate temperature. For example, any manner of heating the tube can be used such as but not limited to using induction or running hot oil over the tube. At 906, pressure can be applied to the tube by clamping dies into the tube to form the tube into predetermined shape. Pressure can be applied by mechanical, hydraulic, pneumatic or other manners. At 908, the shaped tube can be cooled to room temperature or other temperature. The shaped tube can be cooled to solidify the tube in its new shape. At 910, the shaped tube can be assembled into a sub-assembly by brazing or soldering with other parts such as a fluid inlet and fluid outlet. For a high volume manufacturing process, the process can be automated.

Figure 10:
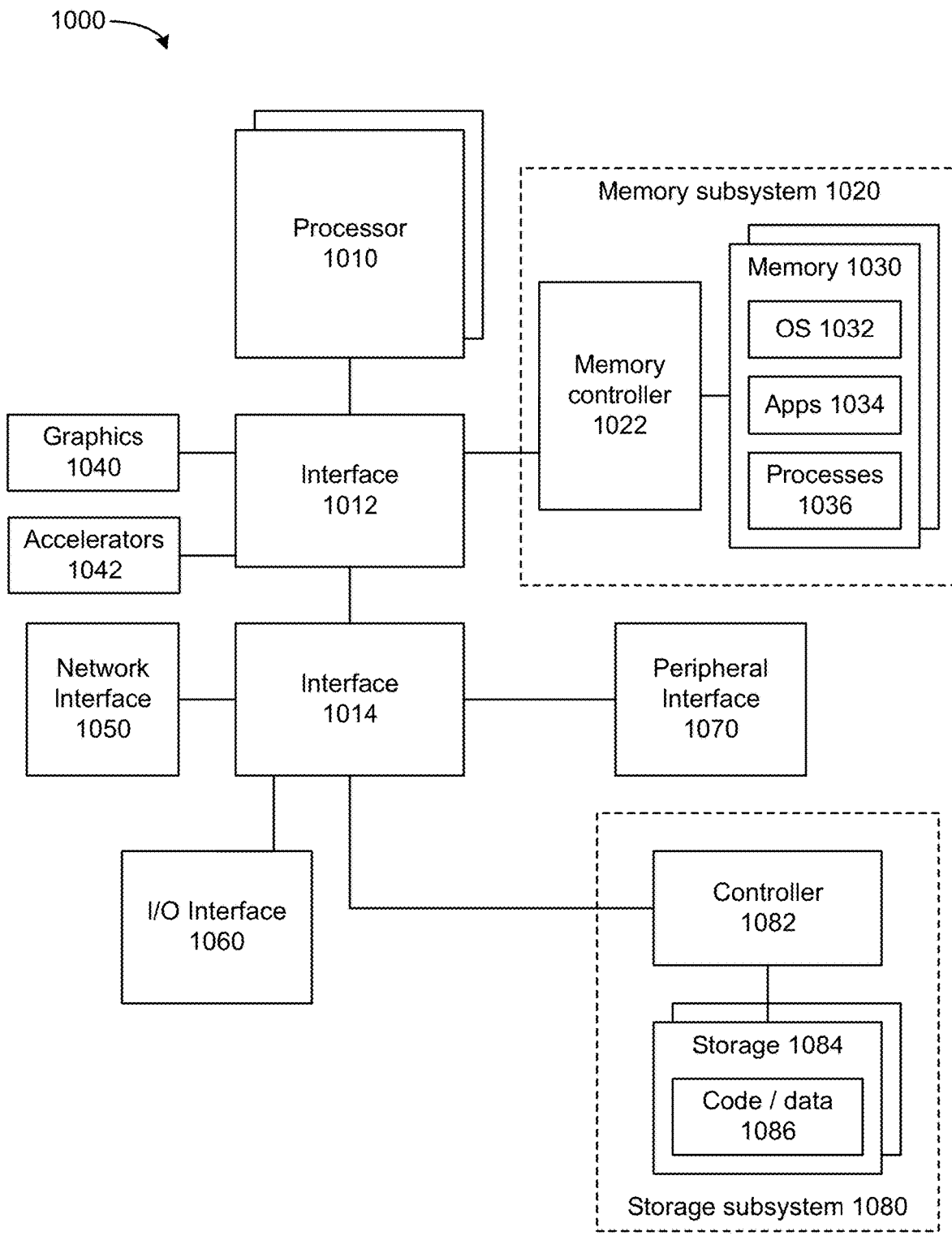
FIG. 10 depicts a system.

FIG. 10 depicts a system. The system can use embodiments described herein to provide fluid cooling using form fitted shaped cooling tubes. System 1000 includes processor 1010, which provides processing, operation management, and execution of instructions for system 1000. Processor 1010 can include any type of microprocessor, central processing unit (CPU), graphics processing unit (GPU), processing core, or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1000 includes interface 1012 coupled to processor 1010, which can represent a higher speed interface or a high throughput interface for system components that needs higher bandwidth connections, such as memory subsystem 1020 or graphics interface components 1040, or accelerators 1042. Interface 1012 represents an interface circuit, which can be a standalone component or integrated onto a processor die. Where present, graphics interface 1040 interfaces to graphics components for providing a visual display to a user of system 1000. In one example, graphics interface 1040 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1040 generates a display based on data stored in memory 1030 or based on operations executed by processor 1010 or both. In one example, graphics interface 1040 generates a display based on data stored in memory 1030 or based on operations executed by processor 1010 or both.

Accelerators 1042 can be a fixed function offload engine that can be accessed or used by a processor 1010. Accelerators 1042 can be coupled to processor 1010 using a memory interface (e.g., DDR4 and DDR5) or using any networking or connection standard described herein. For example, an accelerator among accelerators 1042 can provide sequential and speculative decoding operations in a manner described herein, compression (DC) capability, cryptography services such as public key encryption (PKE), cipher, hash/authentication capabilities, decryption, or other capabilities or services. In some embodiments, in addition or alternatively, an accelerator among accelerators 1042 provides field select controller capabilities as described herein. In some cases, accelerators 1042 can be integrated into a CPU socket (e.g., a connector to a motherboard or circuit board that includes a CPU and provides an electrical interface with the CPU). For example, accelerators 1042 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 1042 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1020 represents the main memory of system 1000 and provides storage for code to be executed by processor 1010, or data values to be used in executing a routine. Memory subsystem 1020 can include one or more memory devices 1030 such as read-only memory (ROM), flash memory, one or more varieties of random access memory (RAM) such as DRAM, or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 1000 includes interface 1014, which can be coupled to interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can transmit data to a device that is in the same data center or rack or a remote device, which can include sending data stored in memory. Network interface 1050 can receive data from a remote device, which can include storing received data into memory. Various embodiments can be used in connection with network interface 1050, processor 1010, and memory subsystem 1020.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (e.g., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (e.g., the value or state of the data is indeterminate if power is interrupted to system 1000). In one example, storage subsystem 1080 includes controller 1082 to interface with storage 1084. In one example controller 1082 is a physical part of interface 1014 or processor 1010 or can include circuits or logic in both processor 1010 and interface 1014.

A volatile memory is memory whose state (and therefore the data stored in it) is indeterminate if power is interrupted to the device. Dynamic volatile memory can involve refreshing the data stored in the device to maintain state. One example of dynamic volatile memory incudes DRAM (Dynamic Random Access Memory), or some variant such as Synchronous DRAM (SDRAM). An example of a volatile memory includes a cache. A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 1000. More specifically, power source typically interfaces to one or multiple power supplies in system 1000 to provide power to the components of system 1000. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1000 can be implemented using interconnected compute sleds of processors, memories, storages, network interfaces, and other components. High speed interconnects between components can be used such as: Ethernet (IEEE 802.3), remote direct memory access (RDMA), InfiniBand, Internet Wide Area RDMA Protocol (iWARP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omnipath, Compute Express Link (CXL), HyperTransport, high-speed fabric, NVLink, Advanced Microcontroller Bus Architecture (AMBA) interconnect, OpenCAPI, Gen-Z, Cache Coherent Interconnect for Accelerators (CCIX), 3GPP Long Term Evolution (LTE) (4G), 3GPP 5G, and variations thereof. Data can be copied or stored to virtualized storage nodes using a protocol such as NVMe over Fabrics (NVMe-oF) or NVMe.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, a blade includes components common to conventional servers, including a main printed circuit board (main board) providing internal wiring (e.g., buses) for coupling appropriate integrated circuits (ICs) and other components mounted to the board.

Figure 11:
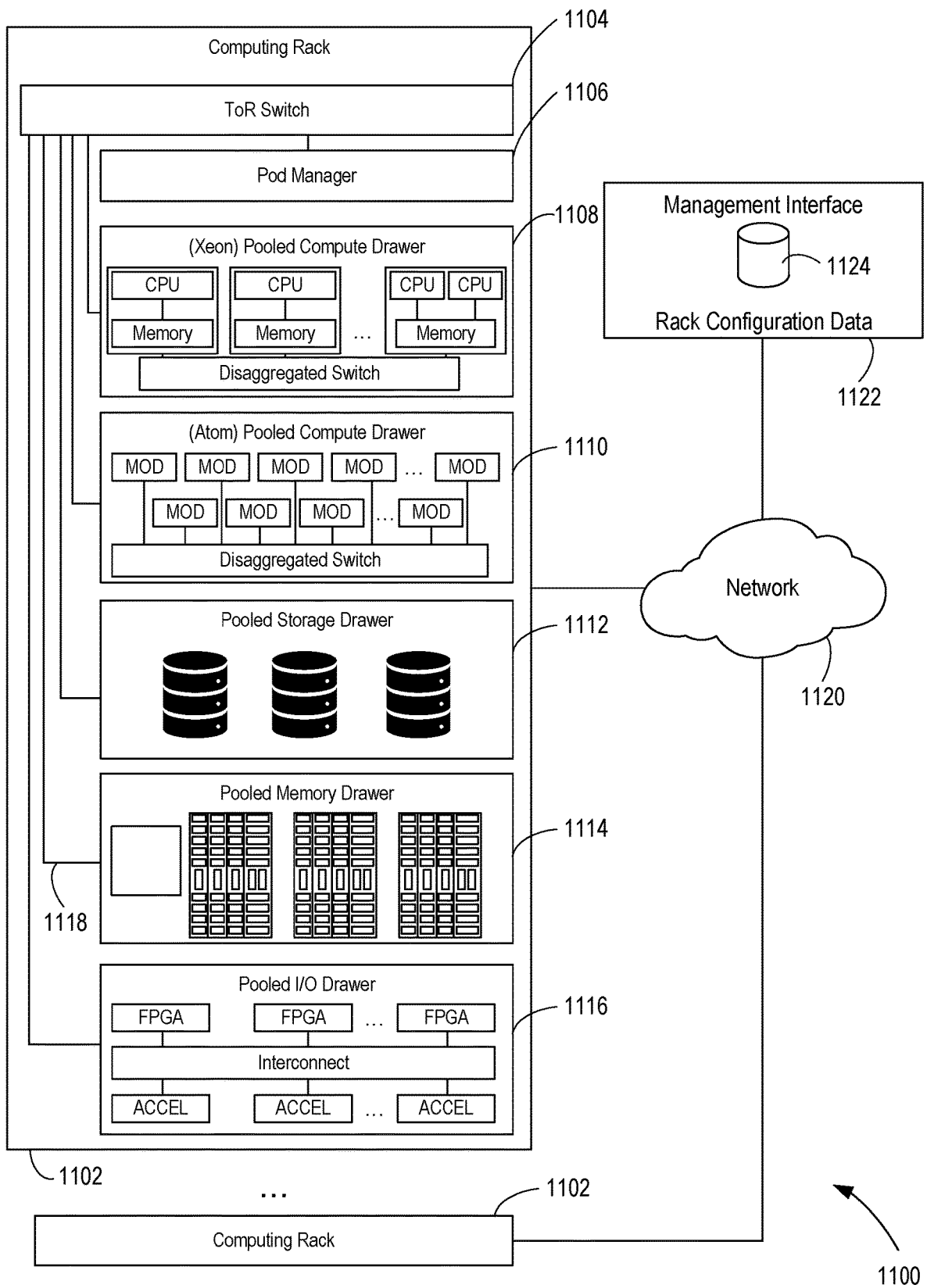
FIG. 11 depicts an example environment.

FIG. 11 depicts an environment 1100 includes multiple computing racks 1102, some including a Top of Rack (ToR) switch 1104, a pod manager 1106, and a plurality of pooled system drawers. Various embodiments can be used with fluid cooling techniques described herein. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 1108, and Intel® ATOM™ pooled compute drawer 1110, a pooled storage drawer 1112, a pooled memory drawer 1114, and a pooled I/O drawer 1116. Some of the pooled system drawers is connected to ToR switch 1104 via a high-speed link 1118, such as a 40 Gigabit/second (Gb/s) or 100 Gb/s Ethernet link or a 100+ Gb/s Silicon Photonics (SiPh) optical link. In one embodiment high-speed link 1118 comprises an 800 Gb/s SiPh optical link.

Multiple of the computing racks 1102 may be interconnected via their ToR switches 1104 (e.g., to a pod-level switch or data center switch), as illustrated by connections to a network 1120. In some embodiments, groups of computing racks 1102 are managed as separate pods via pod manager(s) 1106. In one embodiment, a single pod manager is used to manage racks in the pod. Alternatively, distributed pod managers may be used for pod management operations.

Environment 1100 further includes a management interface 1122 that is used to manage various aspects of the environment. This includes managing rack configuration, with corresponding parameters stored as rack configuration data 1124.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," or "logic." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Flow diagrams as illustrated herein provide examples of sequences of various process actions. The flow diagrams can indicate operations to be executed by a software or firmware routine, as well as physical operations. In some embodiments, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, and so forth.

Example 1 includes a method comprising: re-shaping a tube to contour non-uniform surfaces and assembling a fluid cooling assembly using the re-shaped tube, the re-shaped tube capable to transfer fluid for cooling of one or more devices.

Example 2 includes any example, wherein the re-shaping a tube to contour non-uniform surfaces comprises applying pressure within the tube and/or a vacuum external to the tube.

Example 3 includes any example, wherein the re-shaping a tube to contour non-uniform surfaces comprises raising a temperature of the tube to soften the tube.

Example 4 includes any example, wherein the re-shaping a tube to contour non-uniform surfaces comprises imprinting into the tube shapes that correspond to the non-uniform surfaces.

Example 5 includes any example, wherein the re-shaping a tube to contour non-uniform surfaces comprises reducing a temperature of the tube after the raising the temperature to permit the re-shaped tube to solidify.

Example 6 includes any example, wherein the tube comprises a heat transferring material.

Example 7 includes any example, wherein the re-shaped tube comprises a tube that contours non-uniform surfaces of a dual inline memory module (DIMM).

Example 8 includes any example, wherein the DIMM comprises memory devices and regions between memory devices and wherein the re-shaped tube is shaped with recesses to receive memory devices and the re-shaped tube is shaped with protrusions to fit between the regions.

Example 9 includes any example, and includes an apparatus comprising: a sub-assembly for a fluid cooling system, the sub-assembly comprising: a fluid inlet; a fluid outlet; and at least one tube that is shaped to conform to surfaces of opposing dual inline memory modules (DIMMs), wherein the at least one tube is to connect to the fluid inlet and the fluid outlet.

Example 10 includes any example, wherein the at least one tube comprises a heat transferring material.

Example 11 includes any example, wherein the DIMM comprises memory devices and regions between memory devices and wherein the at least one tube is shaped with recesses to receive memory devices and the at least one tube is shaped with protrusions to fit within the regions.

Example 12 includes any example, wherein the at least one tube is formed as a re-shaped tube by shaping of a tube.

Example 13 includes any example, wherein the re-shaped tube is formed by application of pressure within the tube and/or a vacuum external to the tube.

Example 14 includes any example, wherein the re-shaped tube is formed by raising a temperature of the tube to soften the tube.

Example 15 includes any example, wherein the re-shaped tube is formed by imprinting into the tube shapes that correspond to non-uniform surfaces.

Example 16 includes any example, wherein the re-shaped tube is formed by reduction of a temperature of the tube after raising the temperature to permit the re-shaped tube to solidify.

Example 17 includes any example, and includes a first DIMM positioned on one side of the at least one tube and a second DIMM positioned on another side of the at least one tube, wherein the at least one tube contours raised and non-raised regions of the first DIMM and the second DIMM.

Example 18 includes any example, and includes a server to use the fluid cooling system to reduce a temperature of at least one DIMM.

Example 19 includes any example, wherein when fluid is provided to the fluid inlet, the fluid flows through at least one tube and to the fluid outlet.

Example 20 includes any example, wherein the fluid provided to the fluid inlet comprises cooled fluid and the fluid received at the fluid outlet is heated by at least one DIMM.

Example 21 includes any example, wherein the at least one tube that is not shaped to be a cylinder, bow-tie, or oval.

What is claimed is:

1. An apparatus comprising:
   a fluid inlet;
   a fluid outlet; and
   a tube shaped to conform to surfaces of opposing dual inline memory modules (DIMMs), the tube to connect to the fluid inlet and the fluid outlet, a first one of the DIMMS includes memory devices and regions between the memory devices, the tube shaped with recesses to receive the memory devices and the tube shaped with protrusions to fit within the regions.

2. The apparatus of claim 1, wherein the tube includes a heat transferring material.

3. The apparatus of claim 1, wherein the tube is formed as a re-shaped tube.

4. The apparatus of claim 3, wherein the re-shaped tube is formed by application of pressure within the tube and/or a vacuum external to the tube.

5. The apparatus of claim 3, wherein the re-shaped tube is formed by raising a temperature of the tube to soften the tube.

6. The apparatus of claim 3, wherein the re-shaped tube is formed by imprinting into the tube shapes that correspond to non-uniform surfaces.

7. The apparatus of claim 3, wherein the re-shaped tube is formed by reduction of a temperature of the tube after raising the temperature to permit the re-shaped tube to solidify.

8. The apparatus of claim 1, wherein the fluid inlet, the fluid outlet, and the tube are associated with a fluid cooling system, the apparatus further including a server to use the fluid cooling system to reduce a temperature of the DIMMS.

9. The apparatus of claim 1, wherein when fluid is to be provided to the fluid inlet, the fluid to flow through the tube and to the fluid outlet.

10. The apparatus of claim 9, wherein the fluid provided to the fluid inlet includes cooled fluid and the fluid received at the fluid outlet is heated by at least one of the DIMMS.

11. The apparatus of claim 1, wherein the tube is shaped to have a shape different than a cylinder, different than a bow-tie, and different than an oval.

12. The apparatus of claim 1, wherein the tube has a non-circular cross-section.

13. An apparatus comprising:
a fluid inlet;
a fluid outlet; and
a tube shaped to conform to surfaces of opposing dual inline memory modules (DIMMs), the tube to connect to the fluid inlet and the fluid outlet, the DIMMs including a first DIMM positioned on a first side of the tube and a second DIMM positioned on a second side of the tube, the tube to contour raised and non-raised regions of the first DIMM and the second DIMM.

14. An apparatus comprising:
a fluid inlet;
a fluid outlet; and
a tube to connect to the fluid inlet and the fluid outlet, the tube including a first inset region and first and second extruded regions distributed along a length of the tube, the first inset region between the first and second extruded regions, the first inset region recessed relative to the first and second extruded regions, the first inset region dimensioned to receive a memory device.

15. The apparatus of claim 14, wherein the tube has a first side and a second side opposite the first side, the first inset region and the first and second extruded regions are on the first side of the tube, and the tube further includes a third extruded region and a second inset region on the second side of the tube.

16. The apparatus of claim 15, wherein a first number of extruded regions on the first side is different than a second number of extruded regions on the second side.

17. The apparatus of claim 15, wherein the second inset region is offset along the length of the tube relative to the first inset region.

18. The apparatus of claim 15, wherein the first and second inset regions are aligned along the length of the tube.

19. The apparatus of claim 14, wherein the memory device corresponds to a dual inline memory module (DIMM).

20. The apparatus of claim 19, wherein the DIMM is a first DIMM, the tube has a first side and a second side opposite the first side, the first side is to contour the first DIMM, and the second side is to contour a second DIMM.

* * * * *